US011005023B2

(12) United States Patent
Giazotto et al.

(10) Patent No.: US 11,005,023 B2
(45) Date of Patent: May 11, 2021

(54) SUPERCONDUCTING LOGIC ELEMENT (71) Applicants: CONSIGLIO NAZIONALE DELLE RICERCHE, Rome (IT); UNIVERSIDAD DEL PAÍS VASCO (UPV), Vizcaya (ES)

(72) Inventors: Francesco Giazotto, Pisa (IT); Elia Strambini, Asciano Pisano (IT); Giorgio De Simoni, Leghorn (IT); F. Sebastian Bergeret Sbarbaro, San Sebastián (ES)

(73) Assignees: CONSIGLIO NAZIONALE DELLE RICERCHE, Rome (IT); UNIVERSIDAD DEL PAÍS VASCO (UPV), Leioa (ES)

( * ) Notice: Subject to any disclaimer, the term of this patent is extended or adjusted under 35 U.S.C. 154(b) by 0 days.

(21) Appl. No.: 16/641,235

(22) PCT Filed: Aug. 23, 2018

(86) PCT No.: PCT/EP2018/072826
§ 371 (c)(1),
(2) Date: Feb. 22, 2020

(87) PCT Pub. No.: WO2019/038409
PCT Pub. Date: Feb. 28, 2019

(65) Prior Publication Data
US 2020/0227617 A1 Jul. 16, 2020

(30) Foreign Application Priority Data
Aug. 24, 2017 (IT) .................. 102017000095994

(51) Int. Cl.
G11C 11/44 (2006.01)
H01L 39/22 (2006.01)
(Continued)

(52) U.S. Cl.
CPC ............ *H01L 39/22* (2013.01); *G11C 11/161* (2013.01); *G11C 11/1673* (2013.01);
(Continued)

(58) Field of Classification Search
CPC ......... H01L 43/08; H01L 43/12; H01L 39/22; H01L 43/10; H01L 39/12; H01L 21/285;
(Continued)

(56) References Cited

U.S. PATENT DOCUMENTS 6,769,170 B1 * 8/2004 Shimazawa ............ B82Y 25/00
360/324.2
8,270,209 B2 9/2012 Herr et al.
(Continued)

FOREIGN PATENT DOCUMENTS

RU 2 554 612 C2 6/2015
RU 2 620 027 C1 5/2017

OTHER PUBLICATIONS

Strambini, E. et al.,"Mesoscopic Josephson junctions with switchable current-phase relation," EPL (Europhysics Letters), vol. 112, No. 1, pp. 17013-p1-17013-p5 (2015).
(Continued)

*Primary Examiner* — Thong Q Le
(74) *Attorney, Agent, or Firm* — Maschoff Brennan (57) ABSTRACT

A superconducting logic element includes a superconducting tunnel junction including first and second superconductors. First and second insulating ferromagnets in contact with the first and second superconductors, respectively, generate by magnetic proximity effect a predetermined density of spin-split states in the first and second superconductors, respectively. A writing element applies a writing current to at least a superconductor and is in contact with one of the first or second insulating ferromagnets, so that the first and second insulating ferromagnets commute, by the mag-
(Continued)

netic field generated by the applied writing current, between a state with parallel magnetization to a state with antiparallel magnetization with respect to each other. The superconducting tunnel junction includes the first or second superconductor between which an insulating layer is arranged with tunnel barrier function, the insulating layer selected between a layer selected from the group consisting of AlOx, AlN, and the first or second insulating ferromagnet.

19 Claims, 9 Drawing Sheets

(51) Int. Cl.
  *G11C 11/16* (2006.01)
  *H01L 39/12* (2006.01)
  *H03K 19/195* (2006.01)

(52) U.S. Cl.
  CPC .......... *G11C 11/1675* (2013.01); *G11C 11/44* (2013.01); *H01L 39/12* (2013.01); *H03K 19/195* (2013.01)

(58) Field of Classification Search
  CPC ....... H01L 27/22; H01L 43/02; H01L 27/222; H01L 27/228; H01L 39/223; H01L 21/28556; H01L 43/04; H01L 21/02532; H01L 21/28568; H01L 27/224; H01L 27/2436; H01L 29/785; H01L 43/06; G11C 11/1675; G11C 11/161; G11C 11/1673; G11C 11/44; G11C 11/16; G11C 11/1659; G11C 11/1655; G11C 11/1657; G11C 11/18; G11C 5/063; G11C 11/1697; G11C 11/223; G11C 11/2297; G11C 13/0038; G11C 13/004; G11C 13/0069; G11C 16/10; G11C 5/147; G11B 5/39; G11B 33/00; G11B 33/10; G11B 5/10; G11B 5/31; G11B 5/33

See application file for complete search history.

(56) References Cited

U.S. PATENT DOCUMENTS

| | | | |
|---|---|---|---|
| 8,971,977 | B2 | 3/2015 | Mukhanov et al. |
| 2002/0121636 | A1* | 9/2002 | Amin .................... H01L 39/223 257/9 |

OTHER PUBLICATIONS

Strambini, E. et al., "Revealing the magnetic proximity effect in EuS/Al bilayers through superconducting tunneling spectroscopy," Physical Review Materials, vol. 1, No. 054402, Pages (2017).

Clarke, J. and Wilhelm, F., "Superconducting quantum bits," Nature, vol. 453, No. 19, pp. 1031-1042 (2008).

Dorojevets, M.,"Opportunities, Challenges, and Projections for Superconductor RSFQ Microprocessors," Proceedings of the 2005 ACM/IEEE Conference on Supercomputing, DOI: 10.1109/SC. 2005.49, pp. 3 (2005).

Julliere, M., "Tunneling between ferromagnetic films," Physics letters, vol. 54 A, No. 3, pp. 225-226 (1975).

Sbiaa, R. et al., "Material with perpendicular magnetic anisotropy by magnetic random access memory," Phys. Status Solidi RRL, vol. 5, No. 12, pp. 413-419 (2011).

Bujnowski, B. et al., "Andreev spectrum of a Josephson junction with spin-split superconductors," EPL (Euro Physics Letters), vol. 115, No. 6, pp. 67001-p1-67001-p6 (2016).

Bergeret, F. S. et al., "Enhancement of the Josephson current by an exchange field in superconductor-ferromagnet structures," Physical review letters, vol. 86, Issue 14, pp. 3140-3143 (2001).

A. Barone, A. and Paternò, G., "Physics and applications of the Josephson effect," John Wiley & Sons, New York, (1982).

* cited by examiner

SUPERCONDUCTING LOGIC ELEMENT

FIELD OF THE INVENTION

The present invention relates to a superconductor computing system and apparatus, and more in detail it relates to a superconducting logic element.

In a particular aspect, the invention relates to a superconductor RAM (Random Access Memory).

DESCRIPTION OF THE PRIOR ART

The technologies of superconductor computing are capable to offer an alternative to existing computing systems owing to huge energy savings and very low heat production, which can permit very high computing power.

In particular, superconductor technologies can bring to quantum computing devices (J. Clarke, F. Wilhelm, "*Superconducting quantum bits*". Nature, vol. 453 (7198): 1031-1042, 2008).

Some devices applicable in quantum computing are based on the known Josephson effect (M. Dorojevets, *Opportunities, "Challenges, and Projections for Superconductor RSFQ Microprocessors*". Conference: Supercomputing. Proceedings of the ACM/IEEE SC 2005 Conference). The Josephson effect consists of a passage of electric current between two superconductor electrodes, separated by a thin layer of non-superconducting or insulating material. According to Josephson, pairs of electrons (Cooper pairs) can move from one electrode to the other, crossing the insulating barrier, by tunnel effect (A. Barone, G. Paternò, "*Physics and applications of the Josephson effect*", New York, Wiley, 1982), and the resulting Josephson current flows in the absence of a voltage bias across the junctions. In other words, it does not dissipate energy.

On the other hand, in M. Julliere, "*Tunneling between insulating ferromagnetic films*", Physics letter A, no 54, vol. 3, 225-226, 1975, a magnetic conductance through a tunnel junction made of two insulating ferromagnetic layers separated by a thin insulating layer has been experimented in conditions of temperature lower than 4.2 K. Such effect, commonly known as magnetoresistive tunnel, is characterized by electrons having a certain spin orientation ("spin-down" or "spin-up") that can move from one insulating ferromagnetic layer to the other through the non-conducting insulating layer, if in one of the two insulating ferromagnets free states with the same spin orientation are available.

In U.S. Pat. No. 8,971,977, a superconducting memory cell is described having a Josephson junction with an insulating ferromagnetic material that has at least two magnetization layers. By making an array of such cells, they can be selectively commuted by means of crossing write word lines. At least two Josephson junctions are stratified, so that an input electric signal in a junction is amplified through the second junction.

In U.S. Pat. No. 8,270,209, an example is described of a device capable of implementing a Random Access Memory of the JMRAM type (Josephson Magnetic Random Access Memory), where the memory cells are SQUID (Superconductive Quantum Interference Device) with two Josephson junctions. In this case, by a combination of the 0-1 states of energy levels present in the SQUID rings, data reading/writing operations on the device are possible.

However, these devices, which are based on magnetic commutation, have normally a high complexity structure and dimensional limits of the layer thicknesses (R. Sbiaa, H. Meng, S. N. Pyramanayagam, "*Material with perpendicular magnetic anisotropy by magnetic random access memory*" no 5, vol. 12, 413-419, 2011).

Moreover, as described in U.S. Pat. No. 8,270,209, as the operation of the JMRAM device is based on a 0-$\pi$ transition of two Josephson junctions, a stratification of at least seven layers like "S-N-F-N-F-N-S" is required, where "S" is a superconductor, "N" is a metal, "F" is a ferromagnet. So, a low density of integration can arise, along with an exposition to structural errors, due to tolerances of application of the thin layers, which can limit the reliability of the device.

In B. Bujnowski, D. Bercioux, F. Konschelle, J. Cayssol and F. S. Bergeret, "*Andreev spectrum of a Josephson junction with spin-split superconductors*" EPL (EuroPhysics Letters), Vol. 115, Num. 6, a voltage-unbiased Josephson current has been described in case of parallel or antiparallel magnetization of the junction.

In F. S. Bergeret, A. F. Volkov and K. B. Efetov, Phys. Rev. Lett., 86 (2001) 3140, the enhancement of the critical Josephson current has been demonstrated in a FI-S/I/FI-S junction by increasing the spin-splitting amplitude.

RU 2554612 discloses a high-frequency superconducting memory element in which two superconducting electrodes and a weak interconnection region are provided, the latter including magnetic layers with direct, tunnel or resonant conductivity and a superconducting layer between them. Unlike previously known Josephson SFS structures, by modifying magnetization direction of one of the magnetic layers in a superconducting film arranged in the weak interconnection region between the magnetic layers, a phase transition from a normal state to a superconducting state occurs, or vice-versa.

Strambini et al, in "Revealing the magnetic proximity effect in EuS/Al bilayers through superconducting tunneling spectroscopy", Physical Review Materials, vol. 1, No. 5, October 2017] disclose magnetic proximity effect in EuS/Al bilayers and that the domain structure of the EuS affects the positions and the line shapes of the exchange-split BCS peaks, showing that an exchange splitting is observed even in the unmagnetized state of the EuS layer. Upon magnetizing the EuS layer, the splitting increases while the peaks change shape. Conductance measurements as a function of bias voltage at the lowest temperatures correlate the line shape of the split BCS DoS to the characteristic domain structure in the ultrathin EuS layer.

RU 2620027 discloses a Josephson phase blast valve including upper and lower superconducting electrodes with current leads, located on a substrate and connected by a weak interconnection area in the form of a thin-film layered structure comprising a 20 to 60 nm thick intermediate layer of a superconducting material with current leads, separated from the lower superconducting electrode by an insulator layer; a 1 to 20 nm thick normal metal layer applied on the side facing the intermediate layer; a 1 to 20 nm thick magnetic material layer applied to the surface of the intermediate layer, not covered by the normal metal layer.

SUMMARY OF THE INVENTION

It is therefore a feature of the present invention to provide a superconducting logic element that has a simple structure, in particular a structure including less layers than the prior art superconducting logic elements.

It is also a feature of the present invention to provide a superconducting logic element that can be implemented as a memory cell.

A particular object is that such superconducting logic element can be implemented as a non-volatile logic element.

It is then a feature of the present invention to provide a superconducting logic element that can be manufactured on micro/nanometric scale by well-known manufacturing technologies.

It is another feature of the present invention to provide a superconducting logic element that can be repeated near other identical elements in order to form an array, without problems of crosstalk.

It is a further feature of the present invention to provide a superconducting logic element that cannot be influenced by external electric, electromagnetic, magnetic fields.

It is also a feature of the present invention to provide a superconducting logic element that, during its operation, can achieve a high energy efficiency owing to its heat dissipation and energy absorption properties.

It is still a feature of the present invention to provide a superconducting logic element that has a high operation frequency.

It is still a feature of the present invention to provide a superconducting logic element that can improve the density of integration and that, if implemented in a computer, allows an increase of the density of information.

These and other objects are achieved by a superconducting logic element comprising:
- a superconducting tunnel junction comprising a first and a second superconductor;
- a first insulating ferromagnet in contact with said first superconductor, configured to generate by magnetic proximity effect a predetermined density of spin-split states in said first superconductor;
- a second insulating ferromagnet in contact with said second superconductor, configured to generate by magnetic proximity effect a predetermined density of spin-split states in said second superconductor;
- a writing element, configured to apply a writing current to at least a superconductor in contact with one of said first or second insulating ferromagnet, so that said first insulating ferromagnet, which is in contact with said first superconductor, and said second insulating ferromagnet, which is in contact with said second superconductor, commute between a state with parallel magnetization and a state with antiparallel magnetization with respect to each other as a consequence of the magnetic field generated by the applied writing current;
- a reading element, configured to provide a voltage bias between said first and said second superconductor, and to provide a measurement signal of a dissipative high- or low-conductance state, respectively, through said superconducting tunnel junction, responsive to said parallel or antiparallel magnetization, respectively, by absolute spin valve effect.

This way, a single tunnel junction is obtained which determines a net distinction between a first state, with low electric resistance and high electric conductance of the junction in case of parallel magnetization, and a second state of high electric resistance and low electric conductance of the junction in case of antiparallel magnetization. This allows, on the one hand, to commute by the writing current the magnetization of a single insulating ferromagnet-superconductor junction, and, on the other hand, to read the state of the element by measuring the current (or voltage) at the ends of the tunnel junction at fixed voltage (or current).

In particular, the dissipative conductance state is exploited according to the absolute spin valve effect, which is a property of superconductor-insulating-superconductor junctions, and according to the fact that the density of states typical of superconductors can be spin-splitted like a Zeeman effect. This spin-splitting is achieved, in the present invention, by means of the magnetic proximity effect, which is obtained through the above-mentioned multilayer junction of superconductor/insulating-ferromagnet.

In other words, on the one hand a different assortment of spin species is achieved in the parallel and antiparallel magnetizations, and on the other hand a perfect insulation for a spin species is obtained through the junction, while the other species is free to flow.

So, in one state, i.e. the parallel magnetization, high conductance is obtained that can be measured as low electric resistance, and in the other state, i.e. the antiparallel magnetization, low conductance is obtained that can be measured as high electric resistance. In particular, in the parallel magnetization of the two insulating ferromagnets, a high-conductance state is present in the junction, since "spin-down" electrons can propagate through the junction.

As a consequence, the dissipative current-tension characteristics of the junction, which can be obtained by the application of a reading current between the first and second superconductor, can be modulated by the writing current that commutates the relative magnetization direction, thus differentiating the spin-splitting assortment in the first and second superconductors.

With respect to the prior art, the present invention is not based on the Josephson current, which is a non-dissipative and unbiased current. Instead, it takes advantage of the Bogoliubov quasiparticle current, i.e. a current of dissipative nature that is determined in a voltage-biased way.

The practically exploited effect is the following. Even if the reading step reads a quasiparticle current, which is a very weak current that does not cause a significant power consumption in spite of its of dissipative nature, the encoding of at least one of the two logic states, namely the switching between parallel and antiparallel magnetizations and vice-versa, requires a significant supercurrent. The latter, however, causes a very low power consumption, since the resistance and the heat generation is practically zero in the superconducting state.

By the present invention, each logic element can be configured to store a digital logic state, 0 or 1, corresponding to the parallel or antiparallel magnetization of the insulating ferromagnet. As described above, the magnetization state can be can be determined by reading the selective quasiparticle current/voltage difference through the junction. which can be measured as a high voltage signal (for example a 0-state), or as a low voltage signal (for example a 1-state), or vice-versa.

Such a configuration allows to provide a low-consumption logic element, since, as above described, the reading step of a logic state can be carried out without significant absorption of electric power and the writing step can be performed by a supercurrent, therefore without significant power consumption.

Moreover, this configuration provides non-volatile logic elements, since the condition of parallel and antiparallel magnetization does not disappear when a voltage is not present at the ends of the junction.

According to the invention, such a logic element can have the superconducting tunnel junction consisting of said first and second superconductor with interposition of an insulating layer with tunnel barrier function, the insulating layer selected from the group consisting of:
- an insulating layer selected from the group consisting of: AlOx, AlN;
- the first or second insulating ferromagnet.

In the former case, the insulating layer can be extremely thin, without losing the insulating properties to provide the tunnel barrier, with similar advantages of possible high density of integration.

In the latter case, the superconducting logic element consists of only four layers, which is an apparent structural advantage, since a high density of integration is possible.

Advantageously, the first or second insulating ferromagnet is a layer selected from the group consisting of: EuS, EuO, EuSe, GdN, YIG. The use of these materials allows generating effects of magnetic proximity in a particularly efficient way.

Advantageously, said first or second superconductor is a layer selected from the group consisting of: Al, Nb, NbN, Ti, Pb, NbNTi.

By using any of these materials to manufacture the first or second superconductor makes it possible to achieve an efficient magnetic proximity effect. Moreover, if a writing current is applied to at least one among the first and second superconductor, provided the current is lower than the critical current of this superconductor, the effect is obtained of generating a magnetic field strong enough for the writing operation, while limiting heat generation.

In a possible embodiment, said insulating layer made of AlOx, AlN has a thickness less than 2 nm.

In a possible embodiment, said insulating layer arranged between said first and second superconductor has a thickness lower than or equal to 10 nm.

In particular, by matching an insulating ferromagnet layer with a sufficiently thin superconducting layer, the effect is obtained of generating a superconducting state, whose insulating ferromagnetic properties are expressed through an effective interaction of exchange of the charge carriers that propagate at the interface between the two materials.

In a possible embodiment, the logic element is configured to belong to an array of logic elements, wherein at least one among said first and second superconductor extends through said logic elements of said array of logic elements and is arranged as a write word line.

In particular, the at least one among the first and second superconductors, which is/are arranged as a write word line, are configured for injection of current for changing the magnetization of at least one of the two superconductor-insulating ferromagnet couples commuting them from a parallel magnetization to an antiparallel magnetization with respect to each other and vice-versa, by means of respective writing states obtained by respective current injections.

In a possible alternative embodiment, said logic element is configured to belong to an array of logic elements and comprises at least one further superconductor arranged as a write word line and in contact with said first or second insulating ferromagnet of logic elements of said array of logic elements.

In particular, the at least one further superconductor arranged as a write word line is configured for injection of current for changing the magnetization of at least one of the two superconductor-insulating ferromagnet couples commuting them from a parallel magnetization to an antiparallel magnetization with respect to each other and vice-versa, by means of respective writing states obtained by respective current injections.

Advantageously, said further superconductor is a layer selected from the group consisting of: Al, Nb, NbN, Ti, Pb, NbNTi. The use of these materials allows generating a critical current, in at least one superconductor having the functionality of write word line, capable of generating a magnetic field whose intensity is sufficient to cause a 0-π rotation of the polarization of the insulating ferromagnet and therefore writing the logic state of the logic element.

According to another aspect of the invention, a superconducting memory is provided whose characteristic is that it comprises an array of superconducting logic elements as described above.

This way, each logic element of each array of logic elements can be configured to store a logic digital state 1 or 0, corresponding to parallel or antiparallel alignment of the insulating ferromagnetic layer.

BRIEF DESCRIPTION OF THE DRAWINGS

Further characteristics and/or advantages of the present invention will be made clearer with the following description of an exemplary embodiment thereof, exemplifying but not limitative, with reference to the attached drawings in which.

DESCRIPTION OF SOME PREFERRED EXEMPLARY EMBODIMENTS

Figure 1:
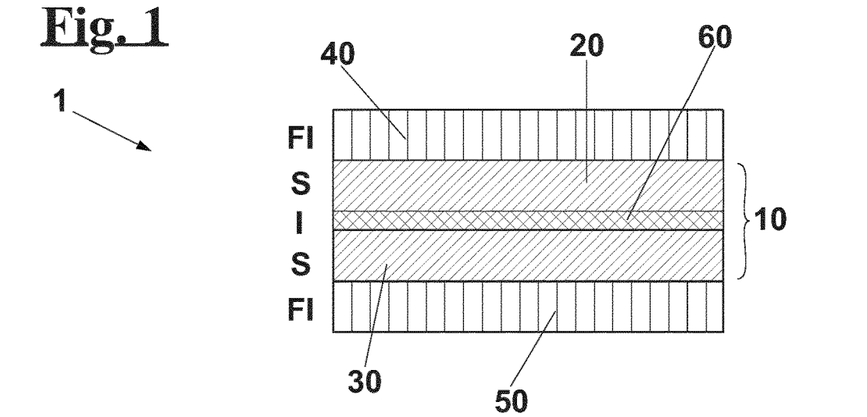
FIG. 1 diagrammatically shows a first exemplary embodiment of a single cell of a superconducting logic element, according to the present invention.

With reference to FIG. 1, in a first possible embodiment, a superconducting logic element 1 comprises a superconducting tunnel junction 10 consisting of a first superconductor 20 and a second superconductor 30. In particular, superconducting tunnel junction 10 is configured to permit passage of currents of quasiparticles by absolute spin-valve effect, as described below.

In order to obtain this effect, superconducting logic element 1 further comprises a first insulating ferromagnet 40, in contact with first superconductor 20, and configured to generate by magnetic proximity effect a predetermined density of spin-split states in first superconductor 20. The superconducting logic element 1 also comprises a second insulating ferromagnet 50 in contact with second superconductor 30 and configured to generate by magnetic proximity effect a predetermined density of spin-split states in second superconductor 30.

The set of insulating ferromagnets 40, 50 and superconductors 20, 30 originates a hybrid superconducting material, where the electric current flows from a superconductor to the other only through tunnel barrier 10. The intensity of such current is determined by absolute spin-valve effect, as below described in different embodiments.

In this first exemplary embodiment, tunnel junction 10 is obtained by arranging between first and second superconductor, 20 and 30, a thin insulating layer 60, for example aluminum oxide or aluminum nitride (AlOx, AlN), which can be extremely thin without losing the insulating properties, thus achieving the goal of permitting high density of integration.

In an exemplary embodiment, the thickness of insulating layer 60 can be less than 2 nm, without losing its insulating properties.

As disclosed above, first insulating ferromagnet 40 or second insulating ferromagnet 50 can be selected from the group consisting of: EuS, EuO, EuSe, GdN, YIG, in order to generate effects of magnetic proximity particularly high.

As also disclosed above, first superconductor 20 or second superconductor 30 can be a layer selected from the group consisting of: Al, Nb, NbN, Ti, Pb, NbNTi, in order to obtain the desired magnetic proximity effect. Furthermore, in case of application of a writing current to at least one among first and second superconductor 20 or 30 made with any of these materials, the effect is obtained of generating a writing critical current, maximizing the magnetic field and limiting in the meantime the production of heat.

Figure 1A:
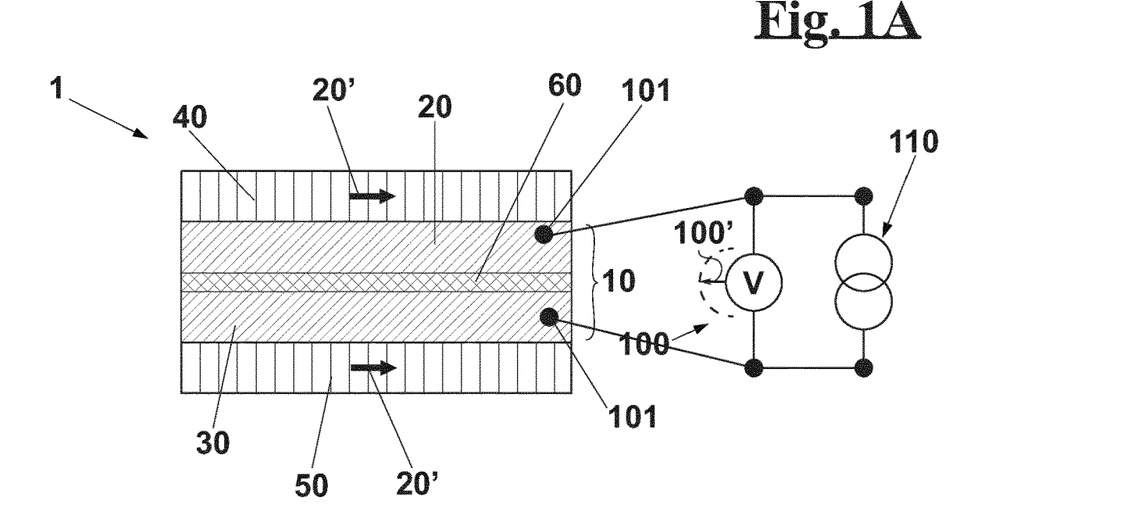
FIGS. 1A and 1B show a current or voltage reading configuration through cell of FIG. 1 in case of parallel or antiparallel magnetization.
Figure 1B:
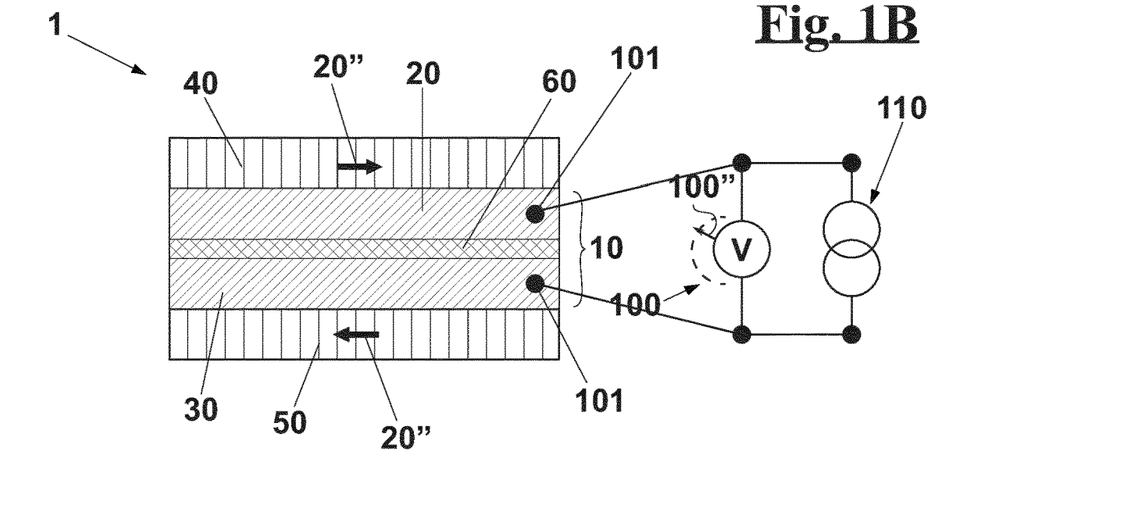

As shown in FIGS. 1A and 1B, through a writing connection not shown for illustrative simplicity, capable of injecting current and generating selectively a magnetic field, the magnetization of the two superconductor-insulating ferromagnet couples 20-40 and 30-50 can be changed, namely two superconductor-insulating ferromagnet couples 20-40 and 30-50 can be commuted from a parallel magnetization to an antiparallel magnetization relatively to each other. In particular, the electric resistance of junction 10 of two superconductor-insulating ferromagnet couples 20-40 and 30-50 depends upon the magnetization state, parallel or antiparallel.

This way, it is possible to provide a reading element, i.e. like reference 100, that is configured to measure a dissipative high- or low-conductance state, respectively, through superconducting tunnel junction 10, responsive to the parallel or antiparallel magnetization, respectively, of couples 20-40 and 30-50. Such different conductance of tunnel junction 10 in case of parallel or antiparallel magnetization represents an application of the absolute spin-valve effect.

More in detail, as shown in the example of FIG. 1A by the concordant directions of arrows 20', the magnetization direction of insulating ferromagnetic layers 40 and 50 is the same, and logic element 1 is in a condition of parallel magnetization. In this case, by the absolute spin-valve effect, in junction 10 a high-conductance state is present that can be measured as a low electric resistance. The "spin-down" electrons can then propagate through the junction to compensate the difference. For example, the conductance state at the ends 101 of tunnel junction 10 can be measured through reading element 100, as shown by arrow 100".

In the case of FIG. 1B, as shown by the direction of arrows 20" not concordant with each other, the magnetization directions of insulating ferromagnetic layers 40, 50 are opposite to each other, and logic element 1 is in condition of antiparallel magnetization. In order to arrive to this state from the parallel state of FIG. 1A, voltage or current is supplied through a voltage or current generator (not shown, see below in FIG. 1C), until exceeding a current threshold, with the effect of creating a 0-π rotation of the magnetization, achieving an antiparallel magnetization of insulating ferromagnetic layers 40, 50 relative to each other.

In this case, the state of antiparallel magnetization determines in junction 10 a low conductance which can be measured as a high electric resistance. So, through reading element 100 a substantial absence of conductance can be determined by reading a voltage variation or a current variation at the ends of tunnel junction 10, with respect to the parallel state of FIG. 1A, as shown by arrow 100'''.

Figure 1C:
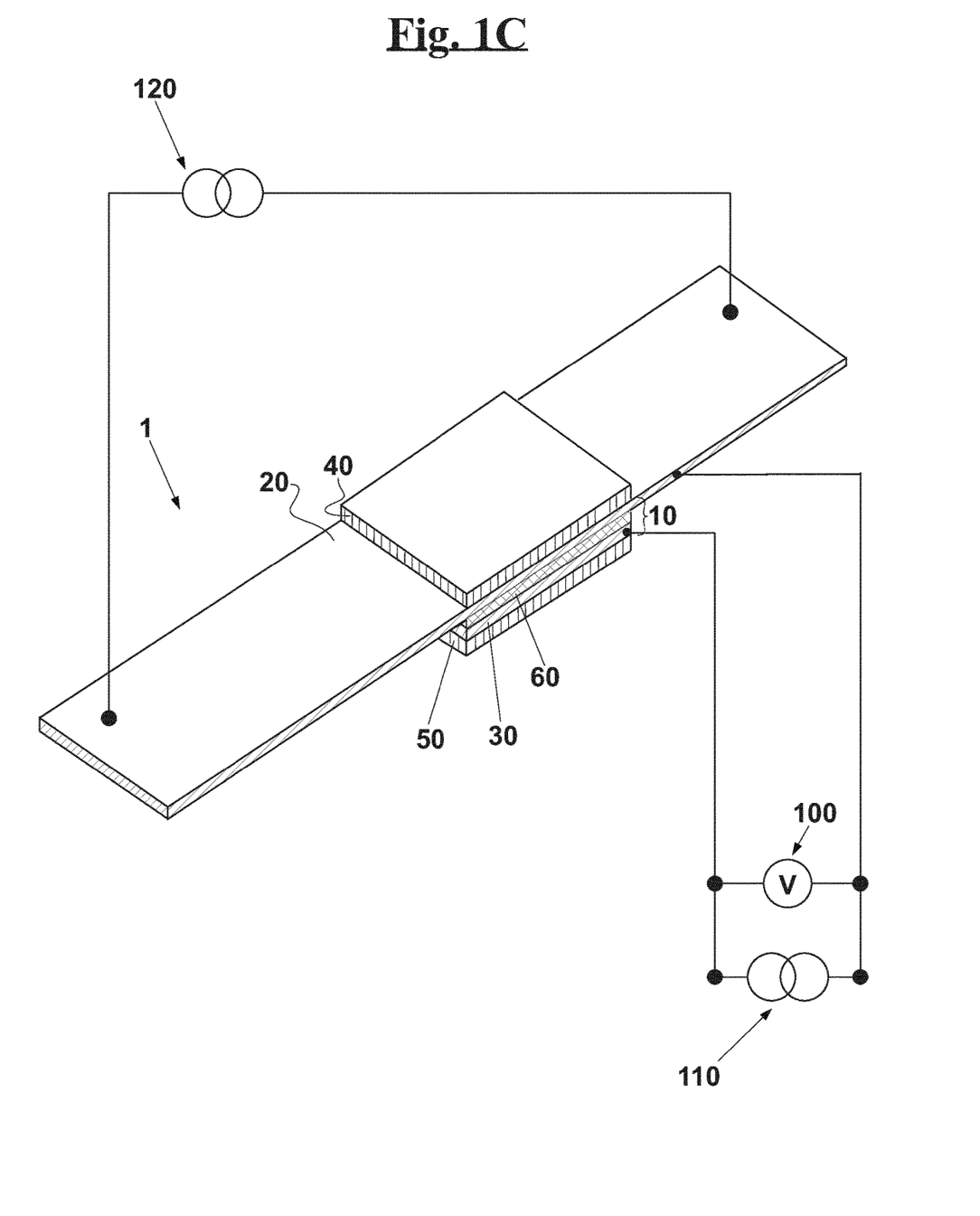
FIG. 1C shows a diagrammatical perspective view of a possible configuration of a superconducting logic element according to FIGS. 1A and 1B, where a superconducting layer is configured also as a write word line.

With reference to FIG. 1C, a diagrammatical perspective view is shown of a possible configuration of a superconducting logic element 1 according to FIGS. 1A and 1B, where a superconducting layer 20 is configured also as a write word line. In the example of FIG. 1C, write word line 20 is directly in contact with insulating ferromagnet 40.

In this case, the writing operation through writing element 20 configured as superconducting write word line is carried out in response to a writing current 120 that flows through it. This writing current is applied to superconducting layer 20 and can generate in the plane of junction 10 a magnetic field, whose intensity can be estimated through the Biot-Savart equation:

$$B(r) = \frac{\mu I}{2\pi r}$$

and whose direction is responsive to the sign of the current. According to the Biot-Savart equation, starting from the thickness of insulating ferromagnetic layer 20, and starting from the intensity of the coercive field, it is possible to determine the amplitude of the minimum current necessary for commuting the magnetization of insulating ferromagnet 20.

The actual commutation of the magnetization can be then measured through the reading element, i.e. 100, 110, which determines a high- or low-conductance state, respectively, through the superconducting tunnel junction 10, consisting of first superconductor 20, first insulating ferromagnet 40 and second superconductor 30, responsive to the parallel or antiparallel magnetization of couples 20-40 and 30-50, as explained above for the cases of FIGS. 1A and 1B. The measuring step can be obtained by applying a reading voltage-bias, i.e. by injecting a reading current by source 110, whose electrons are spin-splitted by magnetic proximity effect, thus obtaining that only the spin-down electrons can migrate through the tunnel junction by the absolute spin valve effect, and the high or low conductance is measured by measuring of voltage changes by voltmeter 100 at the ends of junction 10.

Figure 2A:
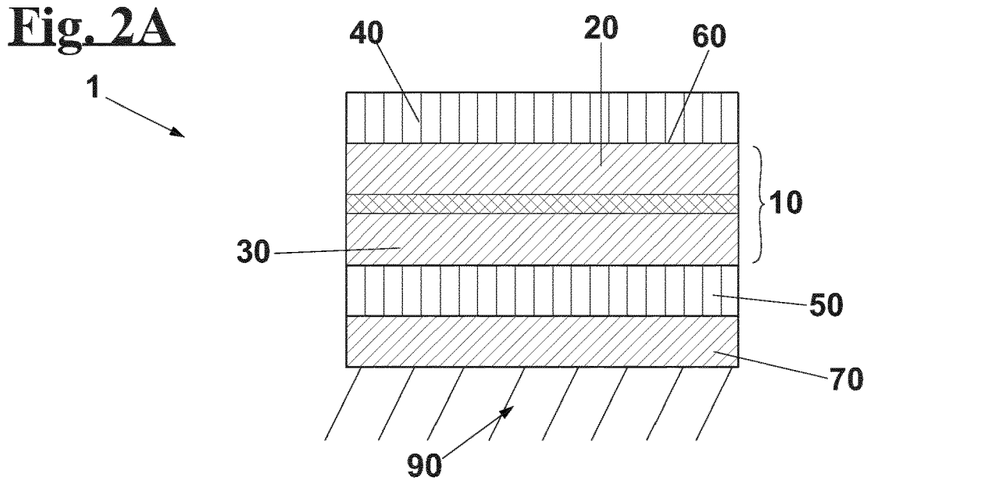
FIG. 2A diagrammatically shows a second exemplary embodiment of a single cell of a superconducting logic element, starting from the element of FIG. 1 with the addition of a writing superconducting layer between the element and a substrate.

With reference to FIG. 2A, in a second possible embodiment, similarly to FIG. 1, a superconducting logic element 1 comprises a superconducting tunnel junction 10 consisting of a first superconductor 20 and a second superconductor 30 and is configured to permit passage of current of quasiparticles. A first insulating ferromagnet 40, in contact with first superconductor 20, is configured to generate by magnetic proximity effect a predetermined density of spin-split states in first superconductor 20, and a second insulating ferromagnet 50, in contact with second superconductor 30, is configured to generate by magnetic proximity effect a predetermined density of spin-split states in second superconductor 30.

Still with reference to FIG. 2A, and differently from FIGS. 1-1C, a third superconducting element 70 is provided between the second insulating ferromagnet 50 and a support substrate 90, in order to generate a writing magnetic field capable of orienting the magnetization of the couple semiconductor-insulating ferromagnet 30-50.

Also in this second exemplary embodiment, tunnel junction 10 is made by arranging a thin insulating layer 60, for example aluminum oxide or aluminum nitride (AlOx, AlN), between first and second superconductor, 20 and 30. The thickness of insulating layer 60 can be less than 2 nm. Concerning the materials of insulating ferromagnets 40,50 and superconductors 20,30, the same features as disclosed for the first embodiment can be provided.

Also superconductor 70 can be a layer selected from the group consisting of: Al, Nb, NbN, Ti, Pb, NbNTi, with the effect of sustaining a high supercurrent for generating the magnetic field capable of rotating of 180° the polarization of insulating ferromagnet 50 and limiting in the meantime the production of heat.

Figure 2B:
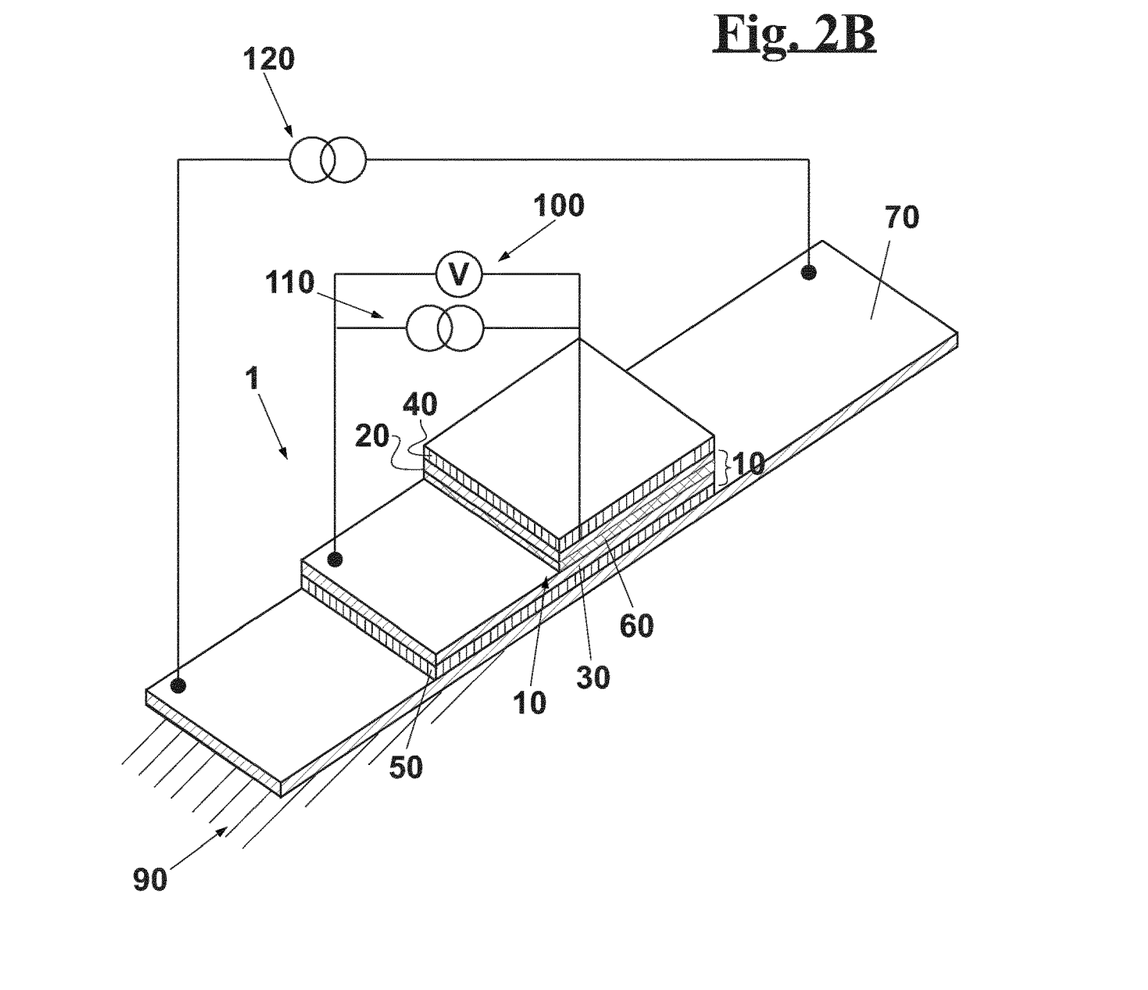
FIG. 2B shows a diagrammatical perspective view of a possible configuration of a superconducting logic element according to FIG. 2A where the added superconducting layer is configured as a write word line.

With reference to FIG. 2B, a diagrammatical perspective view is shown of a possible configuration of a superconducting logic element according to FIG. 2A, in which superconducting element 70 is configured as a write word line. Similarly to FIG. 1C, a reading element, i.e. 100, 110, can be provided configured to measure a dissipative high- or low-conductance state, respectively, through superconducting tunnel junction 10 consisting of first superconductor 20, first insulating ferromagnet 40 and second superconductor 30, responsive to the parallel or antiparallel magnetization of couples 20-40 and 30-50.

Like for the embodiment of FIG. 1C, the writing operation through superconducting element 70 of FIG. 2B is carried out in response to the supply of a control current 120 that flows through it, which can be determined through cited Biot-Savart equation.

Figure 3A:
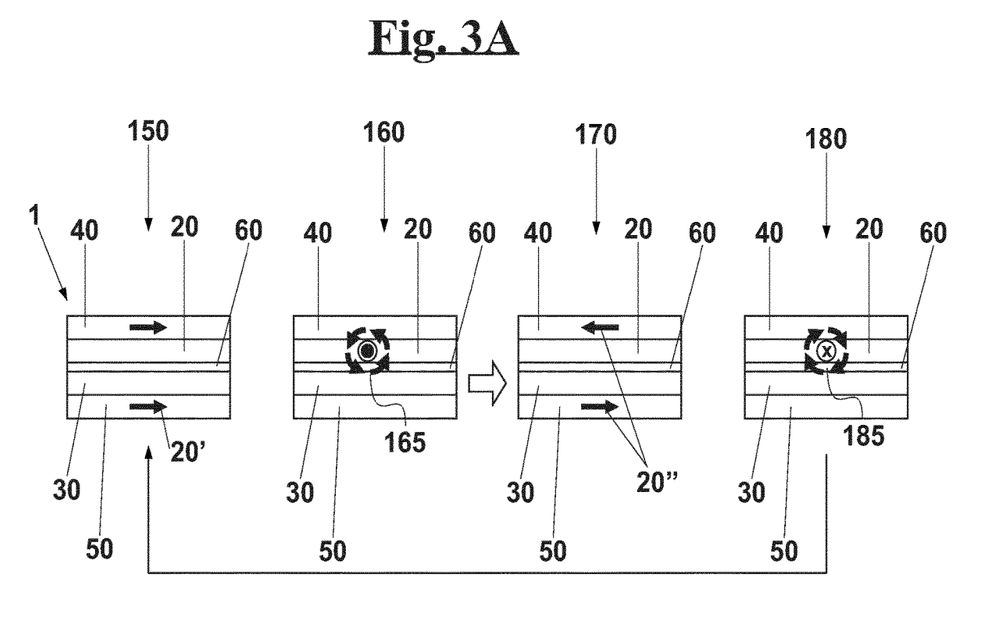
FIGS. 3A and 3B show possible writing steps for the configurations respectively of FIGS. 1C and 2B.

In FIG. 3A a possible succession is shown of writing steps for superconducting logic element 1 of FIG. 1C, through a writing element 20. By a selective generation of a magnetic field, it is possible to change the magnetization of at least one of the two superconductor-insulating ferromagnet couples 20-40 and 30-50 commuting it from a parallel magnetization 150 to an antiparallel magnetization 170 with respect to each other, by means of writing states 160, 180.

Logic element 1 is firstly in a state of parallel magnetization 150, as indicated by the concordant directions of arrows 20', characterized by high conductance and low resistance.

In commutation state 160, for writing on element 20 there is the need, for example, of an injecting current 165, obtaining an inversion of the magnetic field in the couple superconductor-insulating ferromagnet 20-40, which pass to an antiparallel magnetization, as indicated by the discordant direction of arrows 20" in state 170. Such state, as described above, is characterized by low conductance and high resistance.

In a further commutation state 180, for writing again on element 20, a similar but opposite current 185 is injected, which causes an inversion of the magnetic field in the couple superconductor-insulating ferromagnet 20-40, and the latter pass back to the parallel magnetization of state 150.

Figure 3B:
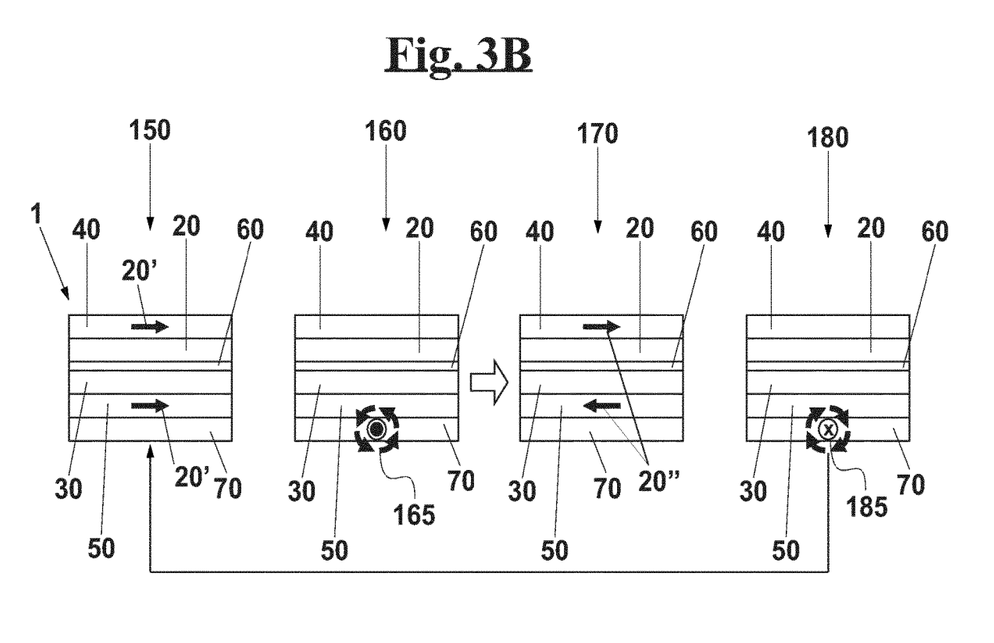

Similarly to FIG. 3A, in FIG. 3B a possible succession is shown of writing steps for superconducting logic element 1 of the embodiment of FIG. 2B, through a writing element 70.

Also in this case, through a selective generation of a magnetic field, it is possible to change the relative magnetization of the two superconductor-insulating ferromagnet couples 20-40 and 30-50 commuting them from a parallel magnetization 150 to an antiparallel magnetization 170 with respect to each other.

The difference from the previous case of FIG. 3A is that the injection of current 165 and 185 in commutation states 160 and 180 are made in writing element 70, which causes a respective inversion of the magnetic field in superconductor-insulating ferromagnet couple 30-50, in order to pass from parallel magnetization state 150 to antiparallel magnetization state 170, and then commuting back to parallel magnetization state 150.

As described above, in both cases of FIGS. 3A, 3B, the reading operation in conductive and not conductive states 150,170 can be carried out, in a not shown way, through a measurement 100 of a voltage drop that occurs upon applying a reading voltage bias, namely after injection 110 of a reading current, whose charge carriers are spin-splitted and selectively flow through tunnel junction 10.

Figure 4A:
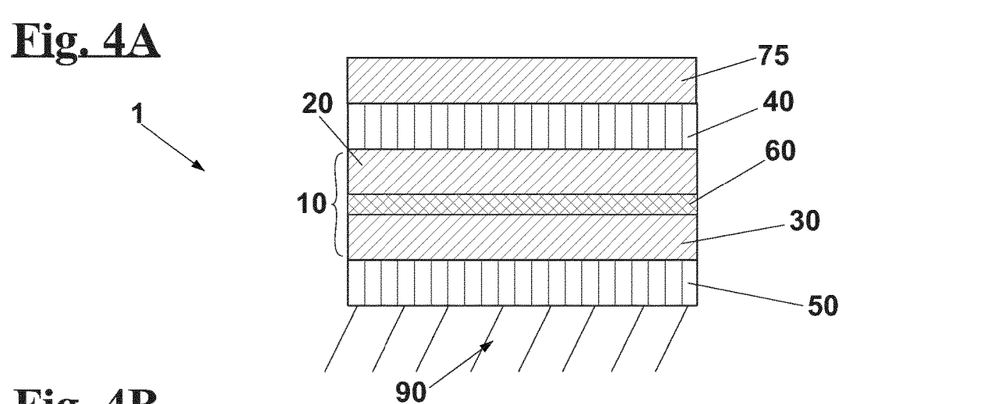
FIG. 4A diagrammatically shows a third exemplary embodiment of a single cell of a superconducting logic element, according to the present invention, starting from the element of FIG. 1 with the addition of a writing superconducting layer between the element and a substrate.

FIG. 4A show a third possible embodiment of the invention, in which superconducting logic element 1 comprises a superconducting tunnel junction 10 like in FIGS. 2A-2B. Logic element 1 also comprises a superconducting element 75 arranged externally to superconducting tunnel junction 10, opposite to support substrate 90, for generating a magnetic field and orienting the magnetization of couple semiconductor-insulating ferromagnet 20-40, instead of superconducting element 70 for generating a magnetic field and orienting the magnetization of couple semiconductor-insulating 30-50.

Figure 4B:
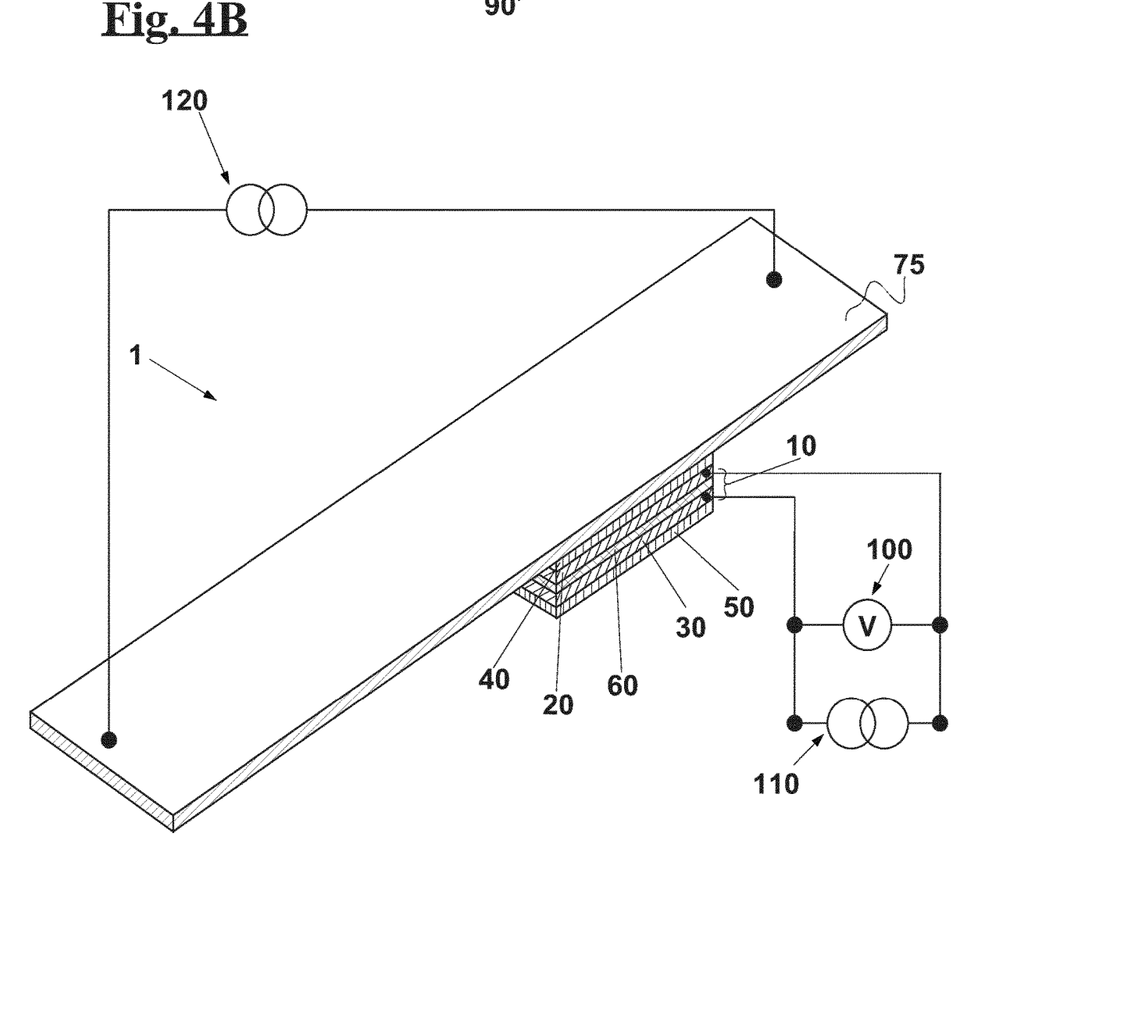
FIG. 4B shows a diagrammatical perspective view of the possible configuration of a superconducting logic element according to FIG. 4A where the added superconducting layer is configured as a write word line.

FIG. 4B show a diagrammatical perspective view of a possible configuration of superconducting logic element 1 according to FIG. 4A, in which where superconducting element 75 is configured as a write word line like superconducting element 70 of FIG. 2B, with commutation states like in FIG. 3A. However, the magnetization of couple superconductor-insulating ferromagnet 20-30 is commuted through a magnetic field generated by outer superconductor 75 with function of write word line. Also in this case, according to the invention, the reading step by reading element 100-110 is carried out as described above.

Figure 5A:
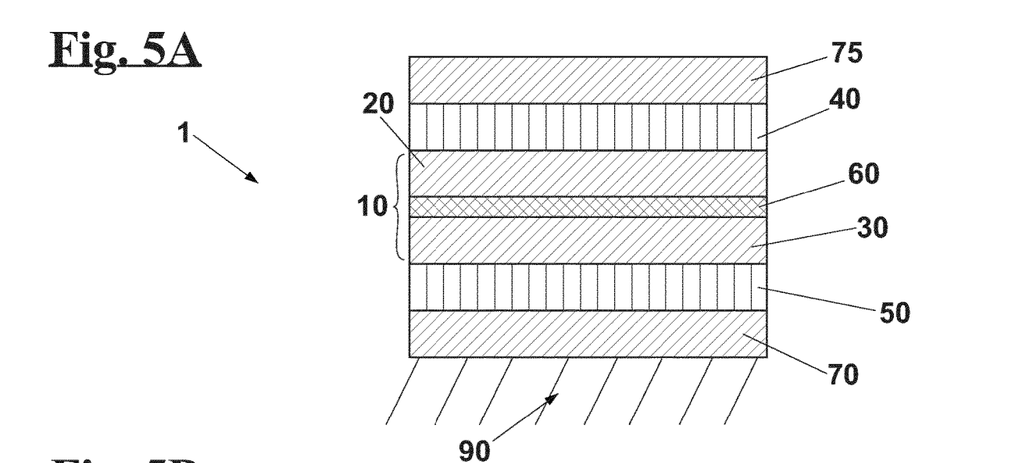
FIG. 5A diagrammatically shows a fourth exemplary embodiment of a single cell of a superconducting logic element, according to the present invention, comprising two writing superconducting layers.

FIG. 5A shows a fourth possible embodiment of the invention, in which superconductor logic element 1 comprises superconducting tunnel junction 10 and is obtained by combining the features of the embodiment of FIGS. 2A-2B with those of the embodiment of FIG. 4A-4B, with the same meaning of the reference numbers. In this case, an inner superconducting element 70 and an outer superconducting elements 75 are both arranged outside of superconducting tunnel junction 10. The former is arranged between superconducting tunnel junction 10 and support substrate 90, whereas the latter is arranged opposite to support substrate 90. Superconducting elements 70 and 75 are necessary to generate respective magnetic fields for orienting the magnetization of the couples superconductor-insulating ferromagnet 30-50 and 20-40, respectively.

Figure 5B:
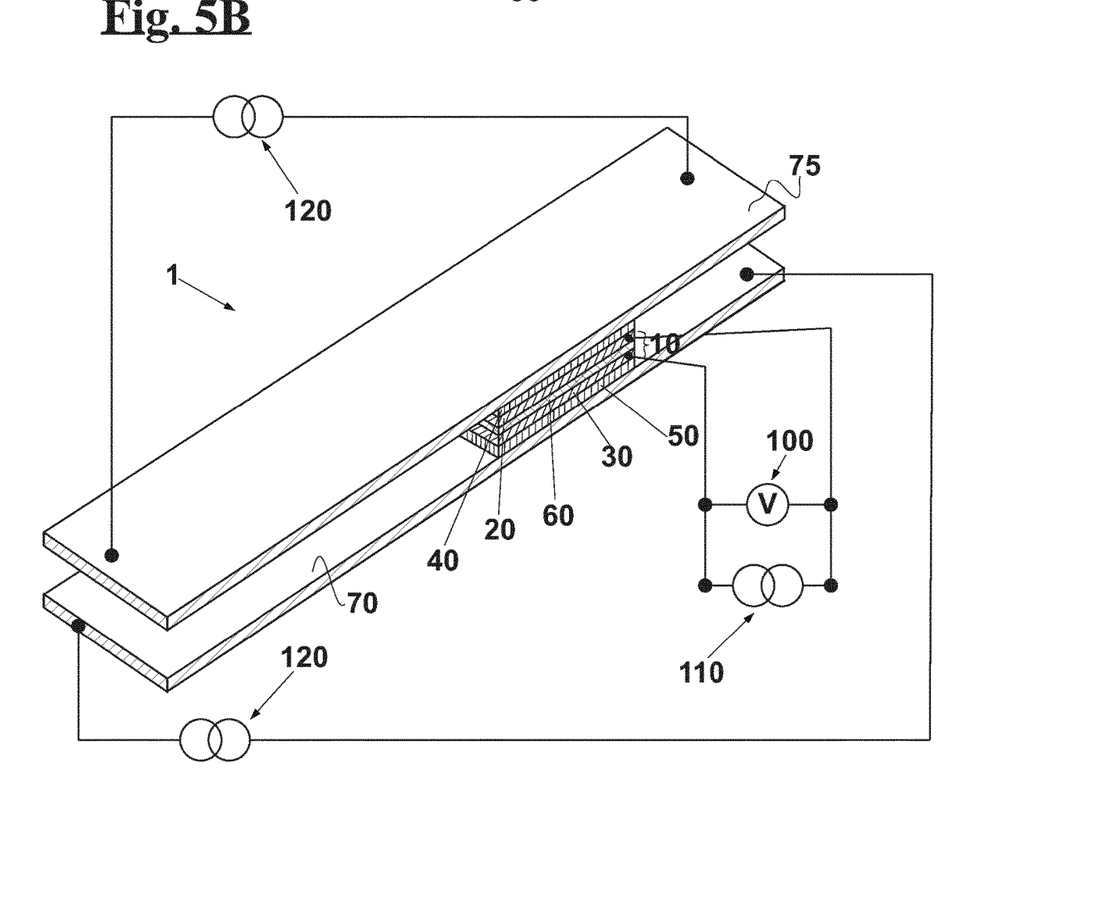
FIG. 5B shows a diagrammatical perspective view of a possible configuration of a superconducting logic element according to FIG. 5A where the two writing superconducting layers are configured as write word lines.

FIG. 5B shows a diagrammatical perspective view of a superconducting logic element 1 having a possible configuration according to FIG. 5A. Inner superconducting element 70 and outer superconducting element 75 are configured as write word lines and are configured to operate the same way as described in FIGS. 2B and 4B, respectively, and have commutation states as indicated in FIGS. 3A and 3B. In this case, the magnetization of both couples superconductor-insulating ferromagnet 20-40 and 30-50 can be changed. More in detail, the magnetization of couple 20-40 can be changed through a magnetic field generated by a current injected in outer superconductor 75 with function of write word line, whereas the magnetization of couple 30-50 can be changed through a magnetic field generated by a current injected in inner superconductor 70 with function of write word line. Also in this case, according to the invention, the reading step by reading elements 100-110 is carried out as described above.

Figure 6:
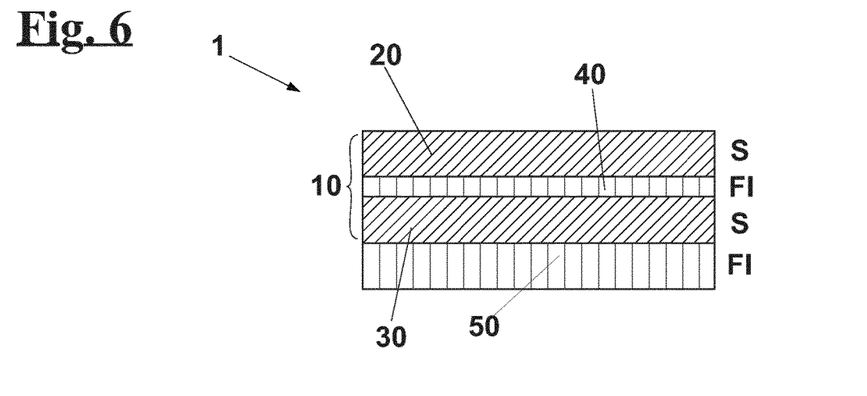
FIG. 6 diagrammatically shows a fifth exemplary embodiment of a single cell of a superconducting logic element, according to the present invention, with one of insulating ferromagnet configured also as insulating tunnel barrier.

FIG. 6 relates to a further possible exemplary embodiment, in which tunnel junction 10 is made by arranging one of the two insulating ferromagnets, in particular first insulating ferromagnet 40, between first superconductor 20 and second superconductor 30.

This way, first insulating ferromagnet 40 serves for forming both first couple superconductor-insulating ferromagnet 20-40, along with first superconductor 20, and tunnel junction 10, along with first superconductor 20 and second superconductor 30. Moreover, first insulating ferromagnet 40 is configured to generate a density of spin-split states in superconducting layer 20 by magnetic proximity effect.

Even in this exemplary embodiment, the set of insulating ferromagnets 40, 50 and superconductors 20, 30 forms a hybrid superconducting material, in which the electric current flows selectively from one superconductor to the other only through tunnel barrier 10.

Like in the above exemplary embodiments, first insulating ferromagnet 40 or second insulating ferromagnet 50 are selected from the group consisting of: EuS, EuO, EuSe, GdN, YIG. These materials allows particularly strong magnetic proximity generation effects.

First superconductor 20 or second superconductor 30, like in the above exemplary embodiments, can be a layer of a material selected among Al, Nb, NbN, Ti, Pb, NbNTi, with the same described effects.

Figure 6A:
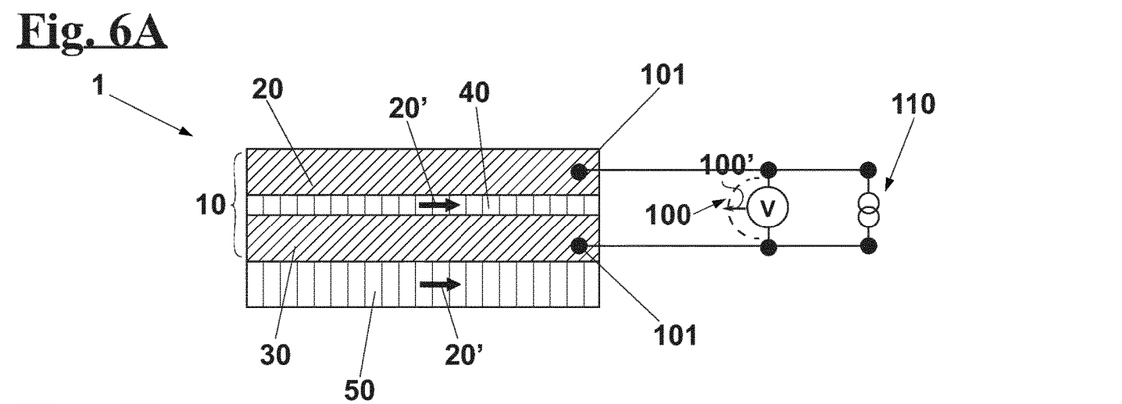
FIGS. 6A and 6B show a current or voltage reading configuration through cell of FIG. 6 in case of parallel or antiparallel magnetization.
Figure 6B:
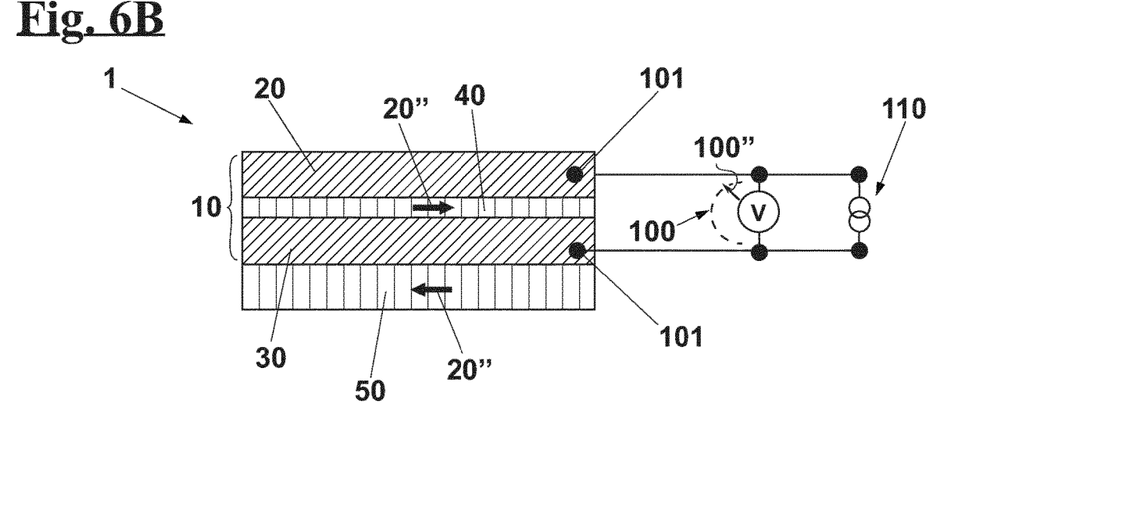

As shown in FIGS. 6A and 6B, two superconductor-insulating ferromagnet couples 20-40 and 30-50 of superconducting logic element 1 of FIG. 6 can be commuted from a parallel magnetization to an antiparallel magnetization with respect to each other, for instance in the same way as superconducting logic element 1 of FIG. 1 (FIGS. 1A and 1B). To this purpose, a writing element is used, not shown, which is configured to selectively generate a magnetic field. Moreover, through a reading element 100, 110, a dissipative high- or low-conductance state can be measured through said superconducting tunnel junction 10 including first superconductor 20, first insulating ferromagnet 40 and second superconductor 30, when couples 20-40 and 30-50 have a parallel or antiparallel magnetization, respectively.

In particular, in FIG. 6A the concordant directions of arrows 20' indicate that the magnetization direction of insulating ferromagnetic layers 40 and 50 is the same, i.e. logic element 1 is in a condition of parallel magnetization. In this case, by the absolute spin-valve effect, a low-conductance state is present in junction 10, which is associated to a low electric resistance. For example, after application of a voltage bias, i.e. a reading current injection 110, the conductance state can be measured through reading element 100, and a voltage or current change can be read at the ends of the tunnel junction 10, as shown by direction arrow 100'.

Instead, in FIG. 6B, the non-concordant direction of arrows 20", indicates that the magnetization direction of insulating ferromagnetic layers 40, 50 is opposite, i.e. logic element 1 is in condition of antiparallel magnetization. In this case, a low conductance and high electric resistance state is present in junction 10.

Figure 6C:
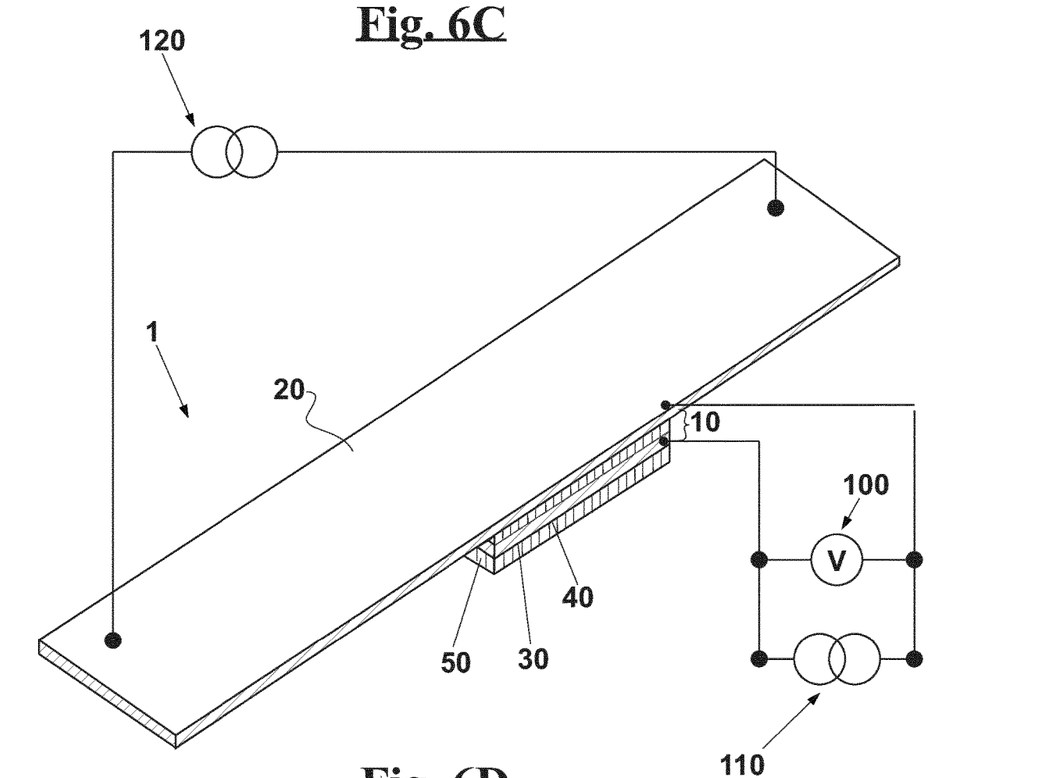
FIG. 6C shows a diagrammatical perspective view of a possible configuration of a superconducting logic element according to FIG. 6 where a superconducting layer is configured as write word line.

FIG. 6C shows a diagrammatical perspective view of a possible configuration of a superconducting logic element 1 according to FIGS. 6, 6A and 6B, in which a superconducting layer 20 is configured as a write word line. Through reading element 100, 110, a dissipative high- or low-conductance state can be measured through said superconducting tunnel junction 10 including first superconductor 20, first insulating ferromagnet 40 and second superconductor 30, when couples 20-40 and 30-50 have a parallel or antiparallel magnetization, respectively.

The writing operation through writing element 20 is carried out in response to a control current 120 that flows through the superconducting write word line, which can generate a magnetic field in the plane of junction 10, whose intensity can be calculated through cited Biot-Savart equation.

Figure 6D:
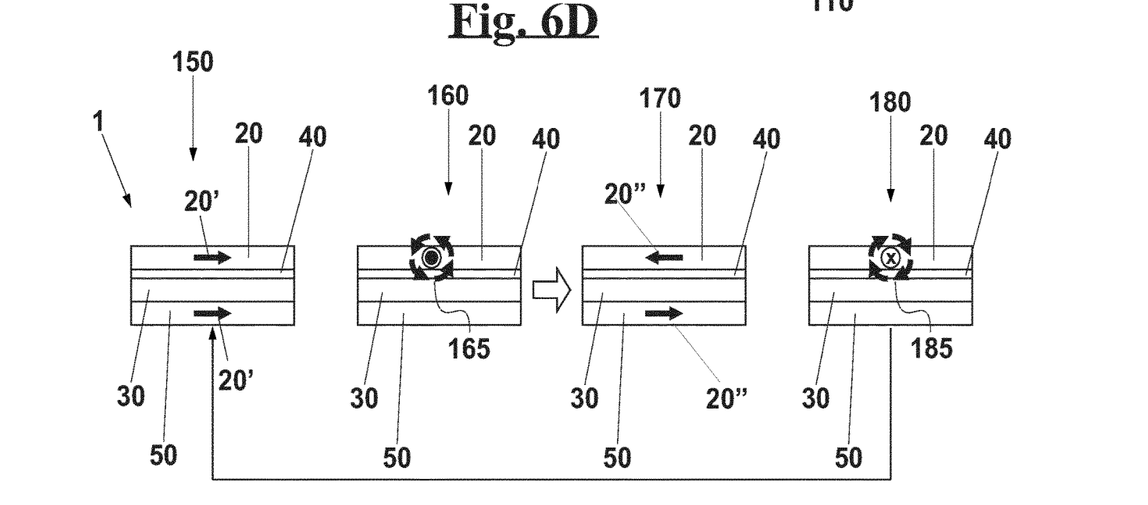
FIG. 6D shows possible writing steps for the configuration of FIG. 6C.

FIG. 6D shows a possible sequence of writing steps for superconducting logic element 1 of FIG. 6C, similarly to FIG. 3A, through a writing element 20. Even in this case, by selectively generating a magnetic field, the relative magnetization of two superconductor-insulating ferromagnet couples 20-40 and 30-50 can be changed by commuting them from a parallel magnetization 150 to an antiparallel magnetization 170 with respect to each other, through writing states 160,180.

As already described, logic element 1 is firstly in a state of parallel magnetization 150, as indicated by the concordant directions of arrows 20', which is characterized by high conductance and low resistance.

As already described for the cases above, commutation 160 allows a step of writing on writing element 20, by a current injection 165, which causes an inversion of the magnetic field in the couple superconductor-insulating ferromagnet 20-40, so as to obtain an antiparallel magnetization, as indicated by the discordant direction of arrows 20" of state 170, which is therefore a low-conductance state.

Instead, in commutation state 180, a similar but opposite current 185 is injected, which causes an inversion of the magnetic field in the couple superconductor-insulating ferromagnet 20-40, and the latter pass back to the parallel magnetization of state 150.

Figure 7A:
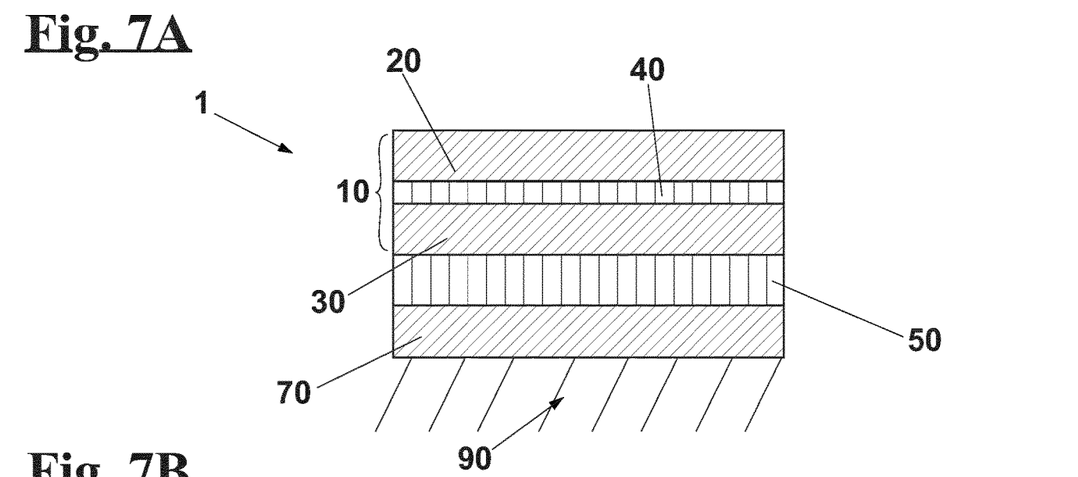
FIG. 7A diagrammatically shows a sixth exemplary embodiment of a single cell of a superconducting logic element, according to the present invention, starting from the element of FIG. 6 with the addition of a writing superconducting layer between the element and a substrate.

With reference to FIG. 7A, in a further exemplary embodiment of the invention, like in the case of FIG. 6, tunnel junction 10 is manufactured by arranging one of the two insulating ferromagnets, in particular first insulating ferromagnet 40 between first and second superconductor 20 and 30. However, a third superconducting element 70 is arranged between second insulating ferromagnet 50 and support substrate 90 for the writing function. Such third superconducting element 70 is configured to generate a magnetic field capable of orienting the magnetization of couple superconductor-insulating ferromagnet 30-50.

The materials of insulating ferromagnets 40,50 and superconductors 20,30 can have the same features as disclosed when describing the previous embodiments.

Figure 7B:
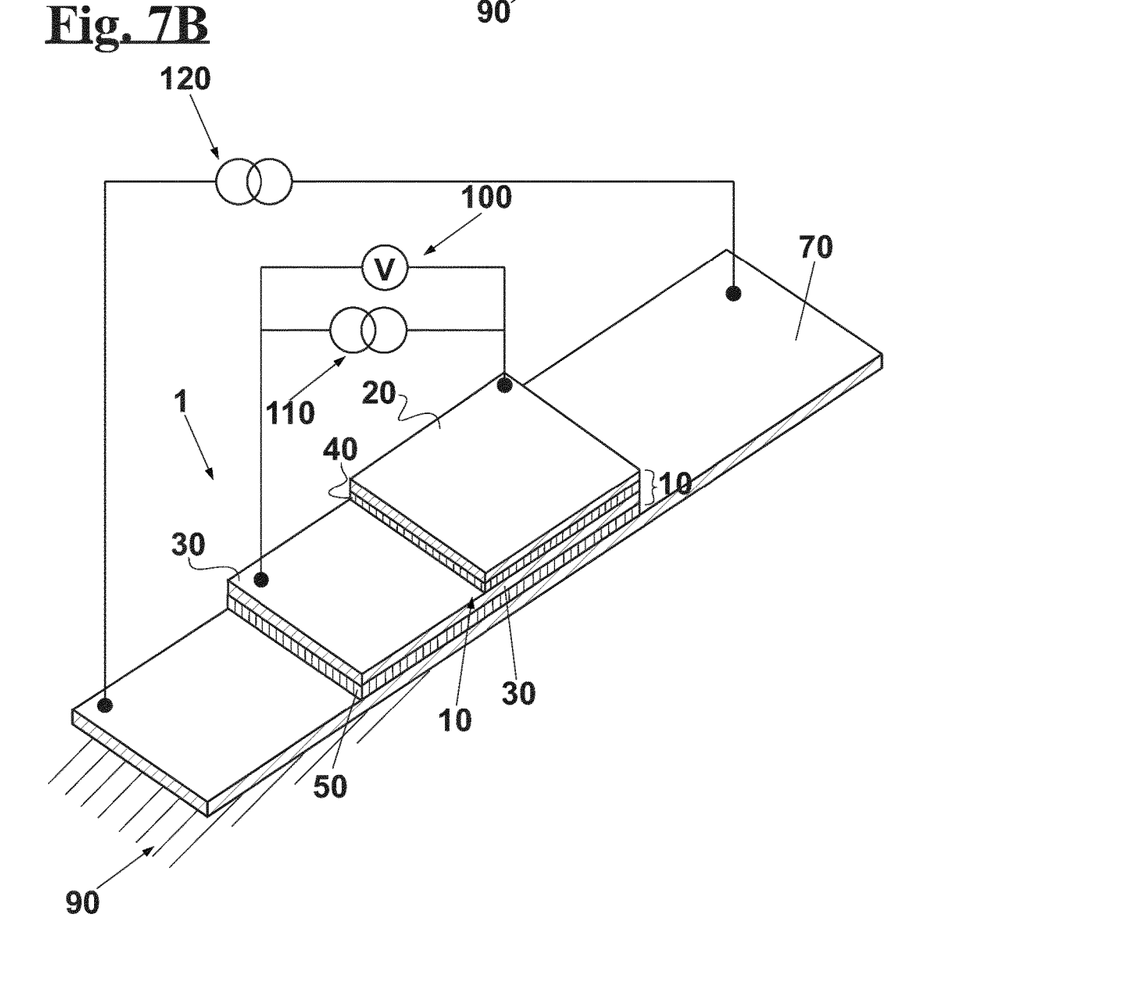
FIG. 7B shows a diagrammatical perspective view of a possible configuration of a superconducting logic element according to FIG. 7A where the added superconducting layer is configured as write word line.

FIG. 7B shows a diagrammatical perspective view of a possible configuration of a superconducting logic element 1 according to FIG. 7A, in which third superconducting element 70 is configured as a write word line.

The description and reference numbers already used for the embodiment of FIG. 6B are also valid for this case. And even in this case the reading step can be made by applying a voltage bias, namely a reading current, and measuring the voltage drop through the junction.

The foregoing description of some exemplary specific embodiments can show the invention from a conceptual viewpoint so that other, by applying current knowledge, will be able to modify and/or adapt in various applications the specific exemplary embodiments without further research and without parting from the invention, and, accordingly, it is meant that such adaptations and modifications will have to be considered as equivalent to the specific embodiments. The means and the materials to perform the different functions described herein could have a different nature without, for this reason, departing from the field of the invention. It is to be understood that the phraseology or terminology that is employed herein is for the purpose of description and not of limitation.

The invention claimed is:

1. A superconducting logic element, comprising:
   a superconducting tunnel junction comprising a first and a second superconductor;
   a first insulating ferromagnet in contact with said first superconductor, configured to generate by magnetic proximity effect a predetermined density of spin-split states in said first superconductor;
   a second insulating ferromagnet in contact with said second superconductor, configured to generate by magnetic proximity effect a predetermined density of spin-split states in said second superconductor;
   a writing element, configured to apply a writing current to at least a superconductor in contact with one of said first or second insulating ferromagnet, so that said first insulating ferromagnet in contact with said first superconductor and said second insulating ferromagnet in contact with said second superconductor commute between a state with parallel magnetization to a state with antiparallel magnetization with respect to each other by the magnetic field generated by the applied writing current;
   a reading element, configured to provide a reading voltage bias between said first and said second superconductor and to provide a measurement signal of a dissipative high- or low-conductance state through said superconducting tunnel junction, respectively, responsive to said parallel or antiparallel magnetization, by absolute spin valve effect,
   wherein said superconducting tunnel junction consists of said first or second superconductor among which an insulating layer is arranged with tunnel barrier function, said insulating layer selected from the group consisting of:
      a layer selected from the group consisting of: AlOx, AN;
      said first or second insulating ferromagnet.

2. The superconducting logic element according to claim 1, wherein each logic element is configured to store a digital logic state, 0 or 1, corresponding to the parallel or antiparallel magnetization of the insulating ferromagnet, determined by reading a selective quasiparticle current/voltage difference through the junction, measured as a high voltage signal, a state 0 is given, or a low voltage signal, to which a state 1 is given, or vice-versa.

3. The superconducting logic element according to claim 1, wherein said first or second insulating ferromagnet is a layer selected from the group consisting of: EuS, EuO, EuSe, GdN, and YIG.

4. The superconducting logic element according to claim 1, wherein said first or second superconductor is a layer selected from the group consisting of: Al, Nb, NbN, Ti, Pb, and NbNTi.

5. The superconducting logic element according to claim 1, wherein said insulating layer has a thickness less than 2 nm.

6. The superconducting logic element according to claim 1, wherein said first or second superconductor have a thickness less than or equal to 10 nm.

7. The superconducting logic element according to claim 1, configured to belong to an array of logic elements, wherein at least one among said first and second superconductors extends through said logic elements of said array of logic elements and is arranged as a write word line.

8. The superconducting logic element according to claim 7, wherein said at least one among said first and second superconductors, arranged as a write word line, are configured for injection of current for changing the magnetization of at least one of said two superconductor-insulating ferromagnet couples commuting them from a parallel magnetization to an antiparallel magnetization with respect to each other and vice-versa, by means of respective writing states obtained by respective current injections.

9. The superconducting logic element according to claim 1, configured to belong to an array of logic elements, comprising at least one further superconductor arranged as a write word line and in contact with said first or second insulating ferromagnet of logic elements of said array of logic elements.

10. The superconducting logic element according to claim 9, wherein said at least one further superconductor arranged as a write word line is configured for injection of current for changing the magnetization of at least one of said two superconductor-insulating ferromagnet couples commuting them from a parallel magnetization to an antiparallel magnetization with respect to each other and vice-versa by means of respective writing states obtained by respective current injections.

11. The superconducting logic element according to claim 9, wherein said further superconductor is a layer selected from the group consisting of: Al, Nb, NbN, Ti, Pb, NbNTi.

12. A superconducting memory comprising an array of superconducting logic elements according to claim 1.

13. The superconducting memory according to claim 9, wherein each logic element of each array of logic elements is configured to store a logic digital state 1 or 0, corresponding to parallel or antiparallel alignment of the insulating ferromagnetic layers, or vice-versa, and wherein each logic element is configured to store said digital logic state, 0 or 1, determined by reading a selective quasiparticle current/voltage difference through the respective junction, measured as a high voltage signal, a state 0 is given, or a low voltage signal, to which a state 1 is given, or vice-versa.

14. A superconducting memory comprising an array of superconducting logic elements according to claim 2.

15. The superconducting memory according to claim 14, wherein each logic element of each array of logic elements is configured to store a logic digital state 1 or 0, corresponding to parallel or antiparallel alignment of the insulating ferromagnetic layers, or vice-versa, and wherein each logic element is configured to store said digital logic state, 0 or 1, determined by reading a selective quasiparticle current/voltage difference through the respective junction, measured as a high voltage signal, a state 0 is given, or a low voltage signal, to which a state 1 is given, or vice-versa.

16. A superconducting memory comprising an array of superconducting logic elements according to claim 3.

17. The superconducting memory according to claim 16, wherein each logic element of each array of logic elements is configured to store a logic digital state 1 or 0, corresponding to parallel or antiparallel alignment of the insulating ferromagnetic layers, or vice-versa, and wherein each logic element is configured to store said digital logic state, 0 or 1, determined by reading a selective quasiparticle current/voltage difference through the respective junction, measured as a high voltage signal, a state 0 is given, or a low voltage signal, to which a state 1 is given, or vice-versa.

18. A superconducting memory comprising an array of superconducting logic elements according to claim 4.

19. The superconducting memory according to claim 18, wherein each logic element of each array of logic elements is configured to store a logic digital state 1 or 0, corresponding to parallel or antiparallel alignment of the insulating ferromagnetic layers, or vice-versa, and wherein each logic element is configured to store said digital logic state, 0 or 1, determined by reading a selective quasiparticle current/voltage difference through the respective junction, measured as a high voltage signal, a state 0 is given, or a low voltage signal, to which a state 1 is given, or vice-versa.

\* \* \* \* \*